US009530855B2

(12) United States Patent
Suzuki et al.

(10) Patent No.: US 9,530,855 B2
(45) Date of Patent: Dec. 27, 2016

(54) SEMICONDUCTOR DEVICE WITH POLYCRYSTALLINE SILICON FILM

(71) Applicant: KABUSHIKI KAISHA TOSHIBA, Minato-ku, Tokyo (JP)

(72) Inventors: Masamichi Suzuki, Tokyo (JP); Yusuke Higashi, Kanagawa (JP); Riichiro Takaishi, Kanagawa (JP); Mitsuhiro Tomita, Tokyo (JP); Kiwamu Sakuma, Mie (JP); Yuichiro Mitani, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/792,879

(22) Filed: Jul. 7, 2015

(65) Prior Publication Data

US 2016/0079434 A1     Mar. 17, 2016

(30) Foreign Application Priority Data

Sep. 11, 2014  (JP) ................. 2014-184893

(51) Int. Cl.
 H01L 29/788     (2006.01)
 H01L 29/68      (2006.01)
 (Continued)

(52) U.S. Cl.
 CPC ..... H01L 29/4925 (2013.01); H01L 21/28273 (2013.01); H01L 27/11541 (2013.01);
 (Continued)

(58) Field of Classification Search
 CPC ................. H01L 27/11524; H01L 29/42324; H01L 23/528; H01L 31/182; H01L 27/11517; H01L 29/788; H01L 29/66825; H01L 29/78391; H01L 29/6684
 See application file for complete search history.

(56) References Cited

U.S. PATENT DOCUMENTS 5,422,504 A * 6/1995 Chang ................... H01L 27/115
                                                    257/315
5,594,688 A * 1/1997 Sato ...................... H01L 27/115
                                                    257/E21.682
(Continued)

FOREIGN PATENT DOCUMENTS

JP     2000-82803     3/2000
JP     2010/62239     3/2010
(Continued)

OTHER PUBLICATIONS

Liu et al., "Influence of Hydrogen Permeability of Liner Nitride Film on Program/Erase Endurance of Split-Gate Typo Flash EEPROMs", Proc. IEEE International Reliability Physics Symposium, pp. 190-196, (2007).

*Primary Examiner* — Thomas L Dickey
*Assistant Examiner* — Damon Hillman
(74) *Attorney, Agent, or Firm* — Finnegan, Henderson, Farabow, Garrett & Dunner LLP

(57) ABSTRACT

This semiconductor device comprises: a gate insulating film provided on a surface of a channel layer; a gate electrode provided on an upper surface of the gate insulating film; and a diffusion layer provided in the channel layer. Furthermore, this semiconductor device comprises: a polycrystalline silicon film provided so as to cover a surface of the gate electrode and the diffusion layer; and an inter-layer insulating film provided so as to cover the gate electrode and the polycrystalline silicon film.

17 Claims, 14 Drawing Sheets

(51) Int. Cl.
*H01L 29/49* (2006.01)
*H01L 29/423* (2006.01)
*H01L 21/28* (2006.01)
*H01L 27/115* (2006.01)
*H01L 23/485* (2006.01)

(52) U.S. Cl.
CPC .... H01L 29/42324 (2013.01); H01L 29/7885 (2013.01); *H01L 23/485* (2013.01); *H01L 2924/0002* (2013.01)

(56) References Cited

U.S. PATENT DOCUMENTS

| | | | |
|---|---|---|---|
| 5,796,140 A * | 8/1998 | Tomioka | H01L 27/115 257/315 |
| 5,972,765 A | 10/1999 | Clark et al. | |
| 8,211,811 B2 | 7/2012 | Matsushita et al. | |
| 2011/0241133 A1 | 10/2011 | Liu | |
| 2013/0341698 A1 | 12/2013 | Sato | |

FOREIGN PATENT DOCUMENTS

| | | |
|---|---|---|
| JP | 2011-210999 | 10/2011 |
| JP | 2014-003235 | 1/2014 |

* cited by examiner

SEMICONDUCTOR DEVICE WITH POLYCRYSTALLINE SILICON FILM

CROSS REFERENCE TO RELATED APPLICATIONS

This application is based on and claims the benefit of priority from prior Japanese Patent Application No. 2014-184893, filed on Sep. 11, 2014, the entire contents of which are incorporated herein by reference.

FIELD

Embodiments described herein relates to a semiconductor device.

BACKGROUND

A MOS transistor is a basic configuration unit of an integrated circuit (LSI) included in a semiconductor device, and one of the most important aspects of performance of the MOS transistor is reliability of its gate insulating film. Reliability of the gate insulating film is known to depend on concentration of hydrogen included in the gate insulating film. For example, in a semiconductor device like a NAND type flash memory, it is usual for a passivation film configured from a silicon nitride film to be provided in a layer above a memory structure. This silicon nitride film contains a lot of hydrogen. Problems sometimes occur when this hydrogen is diffused to the gate insulating film. One such problem is that reliability of the gate insulating film degrades and a threshold voltage of the transistor fluctuates.

Accordingly, there has been proposed a method of manufacturing a semiconductor device in which a hydrogen block layer which is for avoiding diffusion of hydrogen and avoiding mixing of hydrogen in the gate insulating film, is provided temporarily midway through a manufacturing process. However, the hydrogen block layer of this conventional technology is provided only during the manufacturing process and is removed by etching in a final product, and is formed with a large film thickness of as much as 800 nm. Moreover, because the hydrogen block layer ends up being removed in the final product, it cannot suppress diffusion of hydrogen after shipment.

DETAILED DESCRIPTION

A semiconductor device according to an embodiment described below comprises: a gate insulating film provided on a surface of a channel layer; a gate electrode provided on an upper surface of the gate insulating film; and a diffusion layer provided in the channel layer. Furthermore, this semiconductor device comprises: a polycrystalline silicon film provided so as to cover a surface of the gate electrode and the diffusion layer; and an inter-layer insulating film provided so as to cover the gate electrode and the polycrystalline silicon film.

The semiconductor device according to the embodiment will be described below with reference to the drawings.

Figure 1:
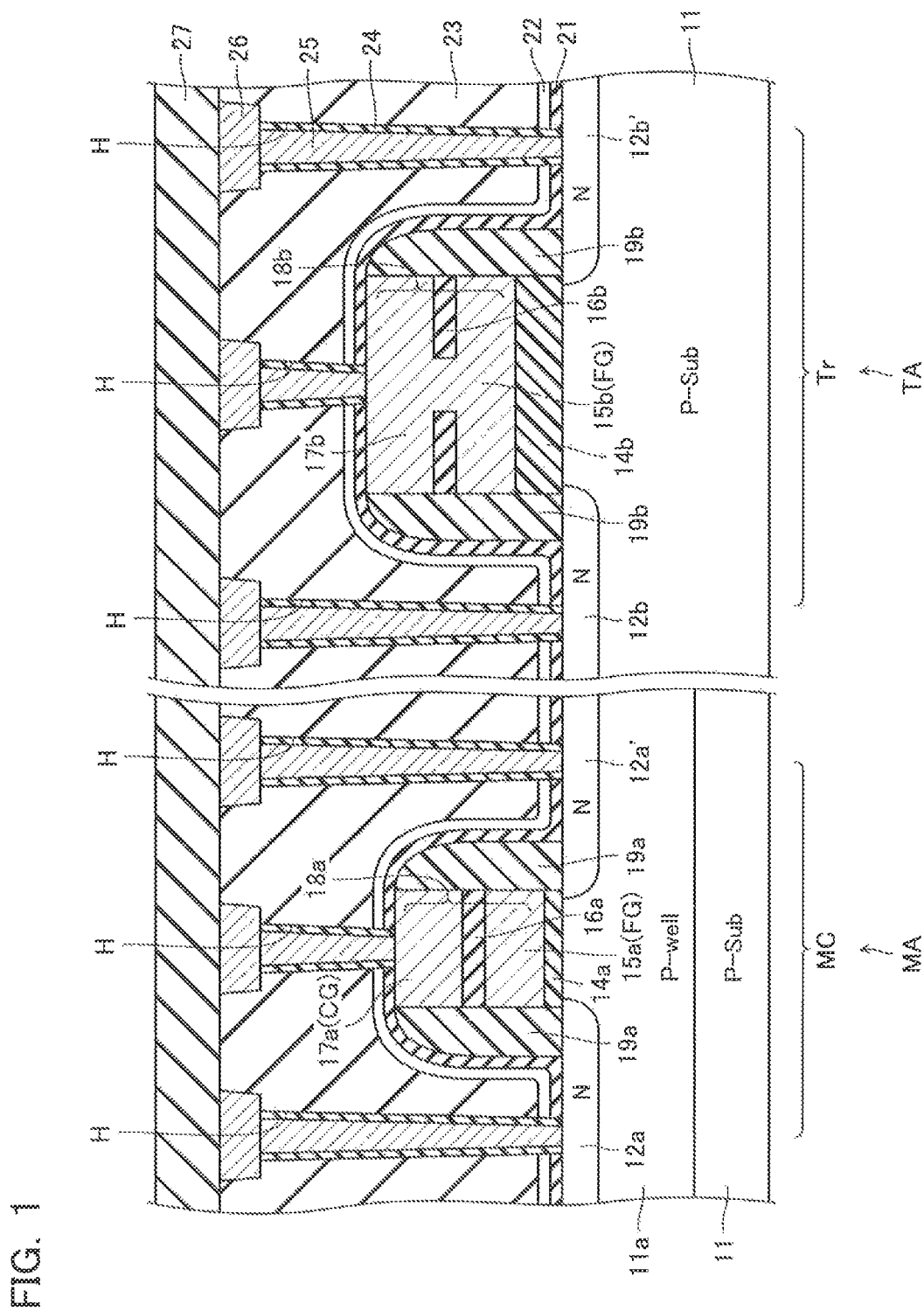
FIG. 1 is a cross-sectional view explaining a structure of a nonvolatile semiconductor memory device according to an embodiment.

FIG. 1 is a schematic cross-sectional view of a memory cell region MA and a peripheral transistor region TA of a nonvolatile semiconductor memory device according to the present embodiment. Dimensions of configuration elements illustrated are sometimes different from an actual scale of each of the configuration elements.

Moreover, below, a flash memory cell is exemplified as a memory transistor, and a semiconductor device in which a flash memory cell transistor and a peripheral transistor are both mounted, is exemplified. However, the present invention is not limited to this configuration, and may be applied to a semiconductor device including a transistor in general.

This nonvolatile semiconductor memory device comprises: a memory cell transistor MC formed in the memory cell region MA; and a peripheral transistor Tr formed in the peripheral transistor region TA and controlling the memory cell transistor MC. The peripheral transistor Tr is, for example, a transistor included in the likes of a row decoder, a column decoder, and a voltage generating circuit, acting as a peripheral circuit.

First, a configuration of the memory cell transistor MC will be described. The memory cell transistor MC comprises: a P type silicon substrate 11; and a gate electrode 18a formed on the silicon substrate 11 via a gate insulating film 14a configured from a silicon oxide film, for example. In a NAND type flash memory, a plurality of the memory transistors MC of the kind shown in this FIG. 1 are connected in series to configure a memory string. Moreover, select transistors (not illustrated) are connected to both ends of this memory string to configure a NAND cell unit.

The gate electrode 18a is configured from: a floating gate (FG) 15a configured from polycrystalline silicon doped with an impurity such as phosphorus (P), for example; an inter-gate insulating film 16a deposited on the floating gate 15a; and a control gate 17a configured from polycrystalline silicon, for example, and deposited on the floating gate 15a via the inter-gate insulating film 16a.

The gate insulating film 14a is configured by a silicon oxide film (SiOx) having a film thickness of about 8 nm, for example. The inter-gate insulating film 16a is also configured from a silicon oxide film (SiOx), for example, having a film thickness of about 8 to 20 nm.

Formed on a side surface of the gate electrode 18a is a sidewall film 19a configured from a silicon oxide film, for example. Moreover, formed in a surface layer portion of the silicon substrate 11 is a P type well 11a. The P type well 11a functions as a channel layer of the memory transistor MC.

Formed in a surface of this P type well 11a so as to sandwich the gate electrode 18a are N type diffusion layers 12a and 12a'. The N type diffusion layers 12a and 12a' act as a source or drain of the memory transistor MC. The diffusion layer 12a is formed by performing ion implantation of an impurity such as phosphorus (P), for example, in a self-aligning manner.

Next, a configuration of the peripheral transistor Tr of the peripheral circuit region TA will be described. The peripheral transistor Tr comprises: the P type silicon substrate 11; a gate insulating film 14b formed on the P type silicon substrate 11 and configured from a silicon oxide film, for example; and a gate electrode 18b. The gate electrode 18b is configured from: a lower gate electrode 15b configured from polycrystalline silicon doped with an impurity such as phosphorus (P), for example; an inter-gate insulating film 16b deposited on the lower gate electrode 15b; and an upper gate electrode 17b formed on the inter-gate insulating film 16b. The gate insulating film 14b has a film thickness of about 20 nm to 50 nm, for example, such that a high breakdown strength of about 5 to 30 V, for example, is obtained. The inter-gate insulating film 16b is configured from an identical material to and formed simultaneously to the previously-mentioned inter-gate insulating film 16a. However, the inter-gate insulating film 16b comprises an opening close to its central portion in order to connect the lower gate electrode 15b and the upper gate electrode 17b.

Formed on a side surface of the gate electrode 18b is a sidewall film 19b configured from a silicon oxide film (SiO2), for example. Formed in a surface layer portion of the P type silicon substrate 11 so as to sandwich the gate electrode 18b are N type diffusion layers 12b and 12b'. The N type diffusion layers 12b and 12b' act as a source or drain of the peripheral transistor Tr. The diffusion layers 12b and 12b' are formed by performing ion implantation of an impurity such as phosphorus (P), for example, in a self-aligning manner. Note that surfaces of the diffusion layers 12a, 12a', 12b, and 12b', and of the gate electrodes 18a and 18b may be silicided by depositing a metal film of the likes of nickel thereon and then performing heat treatment, for the purpose of lowering their resistance.

A liner film 21 and a polycrystalline silicon film 22 are deposited in that order so as to cover the gate electrodes 18a and 18b of the memory transistor MC and the peripheral transistor Tr, and the diffusion layers 12a, 12a', 12b, and 12b' described above. The liner film 21 and the polycrystalline silicon film 22 are formed along an uneven surface that results from the silicon substrate 11 and the gate electrodes 18a and 18b. In addition, the liner film 21 and the polycrystalline silicon film 22 are formed continuously over a plurality of the memory transistors MC in the memory cell region MA, and are formed continuously over a plurality of the peripheral transistors Tr in the peripheral circuit region TA. Moreover, the polycrystalline silicon film 22 is formed having a film thickness of 8 nm or more in a cross section thereof, and so as to have an average particle diameter of 30 nm or less in a plan view thereof, in order to provide a function of preventing diffusion of hydrogen.

The liner film 21 is configured from an insulating film of the likes of a silicon oxide film (SiOx), for example, and is deposited so as to have a film thickness of about 5 to 20 nm, for example. The liner film 21 is formed at least between the diffusion layers 12a, 12a', 12b, and 12b' and the polycrystalline silicon film 22 and between the gate electrodes 18a and 18b and the polycrystalline silicon film 22, and has a function of electrically insulating between the two.

Moreover, if the resistivity of the polycrystalline silicon film 22 is low, and the polycrystalline silicon film 22 and the diffusion layers 12a, 12a', 12b, and 12b' contact each other, while the polycrystalline silicon film 22 and the gate electrodes 18a and 18b contact each other, there is a risk that the diffusion layers 12a, 12a', 12b, and 12b' and the gate electrodes 18a and 18b end up being electrically short-circuited. Depositing the liner film 21 in the above-described way makes it possible for the diffusion layers 12a, 12a', 12b, and 12b' and the gate electrodes 18a and 18b to be electrically insulated. In the case that resistivity of the polycrystalline silicon film 22 is sufficiently high, this liner film 21 may also be omitted. That is, in the case that resistivity of the polycrystalline silicon film 22 is sufficiently high, the polycrystalline silicon film 22 may directly contact the diffusion layers 12a, 12a', 12b, and 12b' and the gate electrodes 18a and 18b.

As will be mentioned later, the polycrystalline silicon film 22 has a function of suppressing movement of hydrogen diffused from other portions, for example, a later-mentioned passivation film 27, and thereby preventing hydrogen being absorbed in the gate insulating films 14a and 14b and reliability degradation.

In addition, an inter-layer insulating film 23 is deposited so as to cover these liner film 21 and polycrystalline silicon film 22 and bury a gate electrode structure (18a and 18b). Moreover, at contact hole H is formed so as to penetrate these inter-layer insulating film 23, polycrystalline silicon film 22, and liner film 21 to reach the diffusion layers 12a, 12a', 12b, and 12b' or the gate electrodes 18a and 18b. Formed in this contact hole H are an isolating insulating film 24 and a contact 25. The isolating insulating film 24 is formed on a sidewall of the contact hole H between the contact 25 and the inter-layer insulating film 23 or the polycrystalline silicon film 22, with a film thickness of 5 nm or more, for example, and has a function of isolating and insulating the contact 25 and the polycrystalline silicon film 22. Note that when resistivity of the polycrystalline silicon film 22 is sufficiently high, this isolating insulating film 24 may be omitted.

Moreover, formed at upper ends of these plurality of contacts 25 is a wiring line 26, and this wiring line 26 is connected to an external circuit not illustrated. Formed on a surface layer portion of the inter-layer insulating film 23 is the passivation film 27. This passivation film 27 includes a silicon nitride film in a part thereof. The silicon nitride film contains a lot of hydrogen. The hydrogen included in the passivation film 27 separates from the passivation film 27 to diffuse downwards, due to a heat process performed when the passivation film 27 is deposited, a voltage stress during use after shipment, various other kinds of stresses. If such hydrogen is diffused to the gate insulating films 14a and 14b, reliability of the gate insulating films 14a and 14b degrades.

However, in the present, embodiment, the polycrystalline silicon film 22 is formed between the passivation film 27 and the gate insulating films 14a and 14b. Therefore, even if hydrogen has diffused from the passivation film 27, almost all of the hydrogen has its movement suppressed by a dangling bond at an interface of the polycrystalline silicon film 22, and is prevented from reaching the gate insulating films 14a and 14b.

Figure 2:
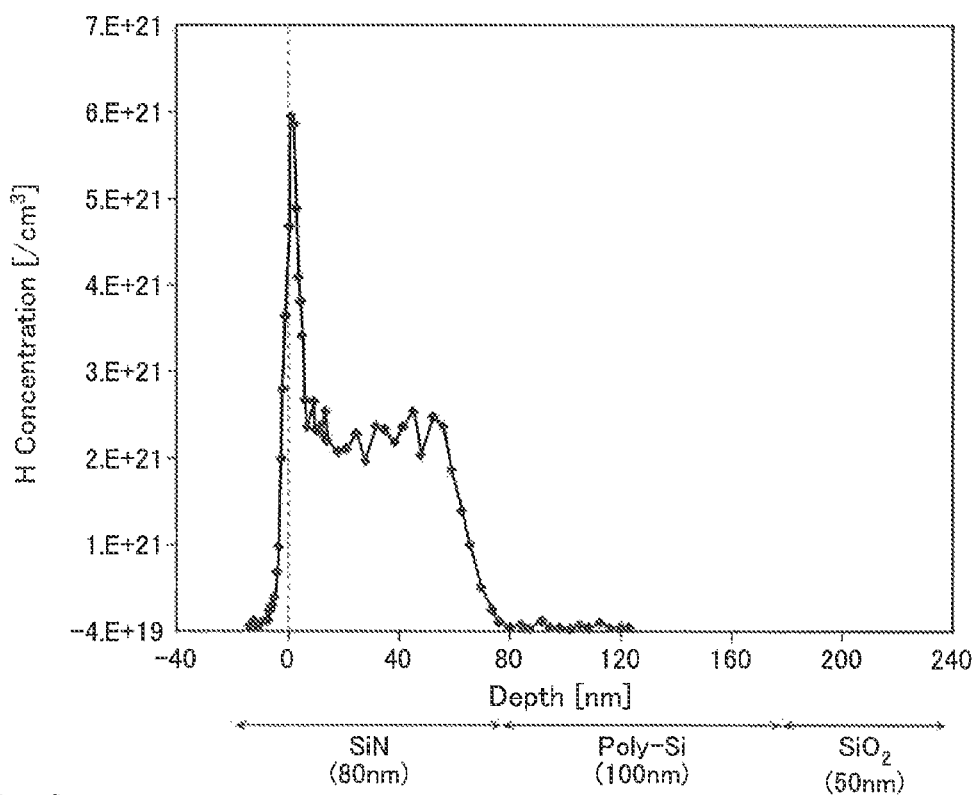
FIG. 2 is a graph explaining an advantage of the structure of the embodiment.

Here, advantages of the polycrystalline silicon film 22 will be described with reference to the graphs of FIGS. 2 to 4. FIG. 2 is a result of implementing depth direction analysis of hydrogen concentration, on a stacked sample, by a resonance nuclear reaction method. The stacked sample has a silicon oxide film (SiO2) of a film thickness of 50 nm deposited on a silicon substrate by a thermal oxidation method, a polycrystalline silicon, film of a film thickness of 100 nm further deposited on the silicon oxide film by a CVD method, and a silicon nitride film (SiN) of a film thickness of 80 nm further deposited on the polycrystalline silicon film by a CVD method. The strong signal observed in a region of a surface (depth of 0 nm) is a signal resulting from hydrogen adsorbed close to the surface of the stacked sample.

As shown in FIG. 2, hydrogen is detected limited to in the silicon nitride film, and is not included in the polycrystalline silicon film or the silicon oxide film. In other words, hydrogen concentration lowers sharply at an interface of the silicon nitride film and the polycrystalline silicon film to have a value close to zero in the polycrystalline silicon film.

Figure 3:
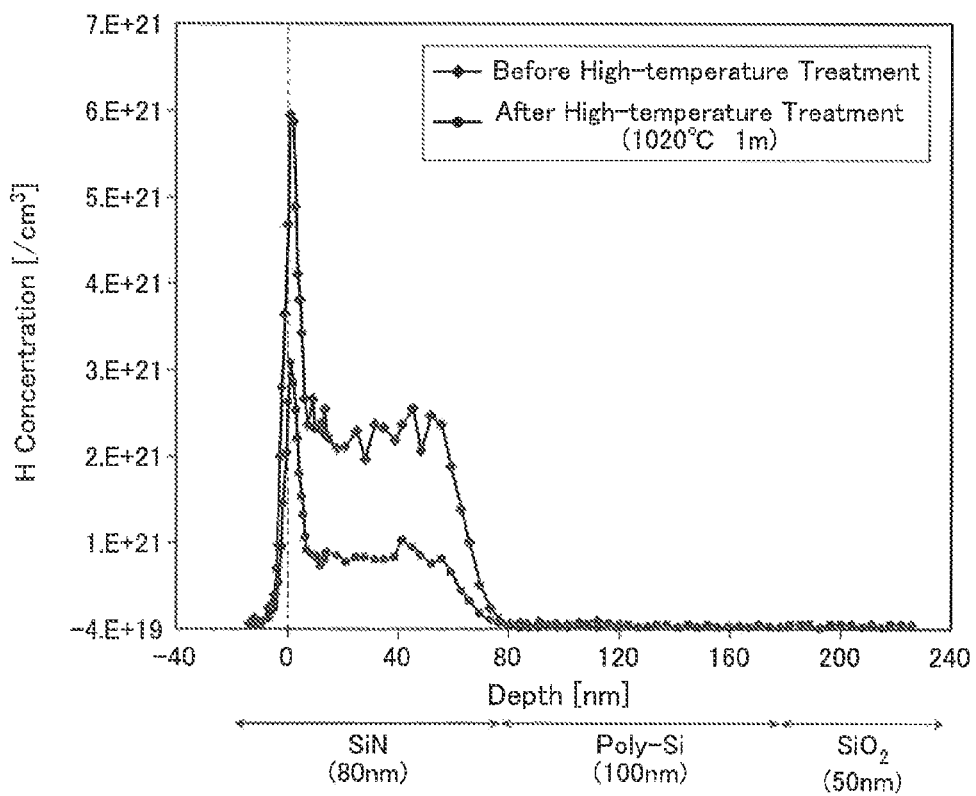
FIG. 3 is a graph explaining an advantage of the structure of the embodiment.

FIG. 3 is a result of depth profile analysis of hydrogen by a resonance nuclear reaction analysis, after implementing high temperature heat treatment at 1020° C. for 1 minute on the stacked sample of FIG. 2. Moreover, FIG. 4 is a partial enlarged view of the graph of FIG. 3. Here, for comparison, a measurement result of FIG. 2 before high temperature heat treatment (before high temperature heat treatment) is also illustrated.

Conventionally, hydrogen included in a silicon nitride film is known to diffuse easily to outside when a high temperature heat treatment process of as much as 1000° C. or more is applied. However, as shown in FIG. 3, it is found that in the above-described stacked sample, the polycrystalline silicon film suppresses downward diffusion of hydrogen included in the silicon nitride film. Rather, hydrogen in the silicon nitride film, diffuses to upwards of the stacked sample, and a hydrogen amount in the silicon nitride film is decreasing.

Figure 4:
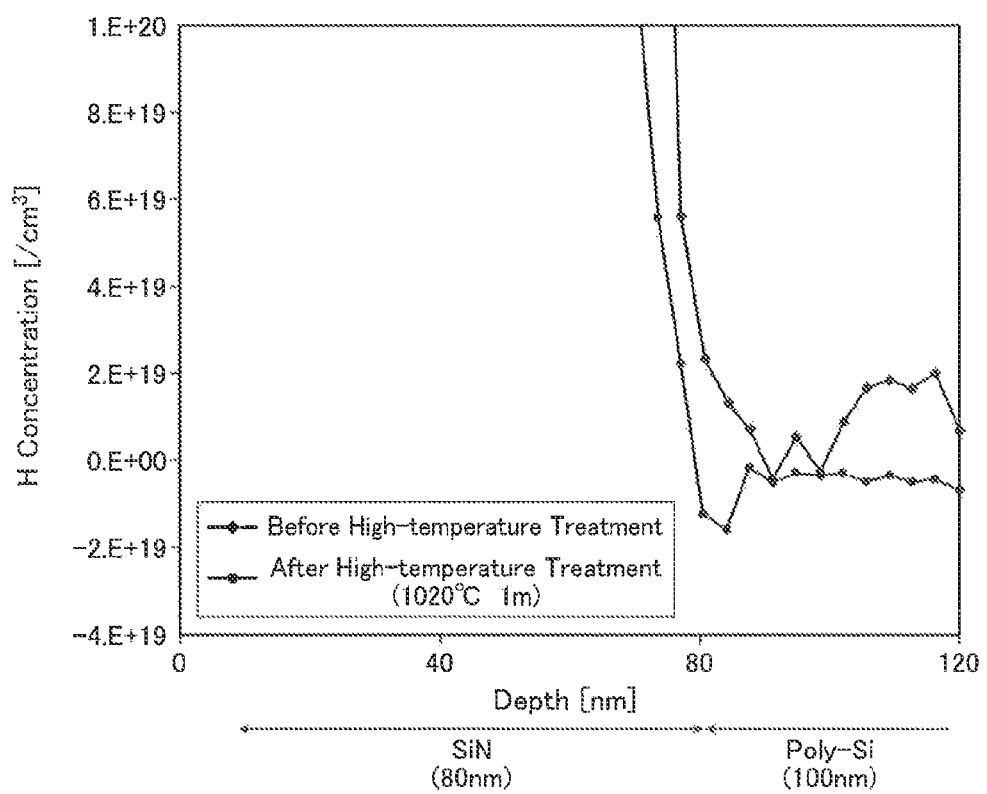
FIG. 4 is a graph explaining an advantage of the structure of the embodiment.

Moreover, as is clear from, the graphs of FIGS. 3 and 4, the concentration of hydrogen in the polycrystalline silicon film is found to decrease sharply close to the interface of the polycrystalline silicon film and the silicon nitride film, hence it is sufficient for film thickness of the polycrystalline silicon film to be extremely small. That is, it is found from this experiment that diffusion of hydrogen can be sufficiently prevented by a polycrystalline silicon film having a thin film of about several nanometers.

A change in distribution of hydrogen at the silicon nitride film/polycrystalline silicon film interface before/after high temperature heat treatment (for example, at 1020° C. for 1 minute) was not observed from the experiment results of FIGS. 3 and 4. Depth resolution of the resonance nuclear reaction analysis in this experiment is 8 nm. It has therefore been clarified from this experiment that provided the polycrystalline silicon film has a film thickness of at least 8 nm or more, diffusion of hydrogen can be completely suppressed.

The hydrogen diffusion-preventing function of the polycrystalline silicon film is thought to stem from hydrogen termination of the dangling bonds in the surface of a crystal particle of the polycrystalline silicon film. That is, it is more desirable for the surface area of crystal particle to be made larger and density of the dangling bond to be increased. Furthermore, to achieve that, it is more desirable for the crystal particle to be small. From, the fact that an average crystal particle in the above-described, experiment was 30 nm, this function is thought to occur if an average particle diameter thereof is 30 nm or less in a plan view thereof.

Next, a method of manufacturing a nonvolatile semiconductor memory device according to the present embodiment will be described. FIGS. 5 to 15 are cross-sectional views showing each of processes of the method of manufacturing a nonvolatile semiconductor memory device according to the present embodiment. Note that FIGS. 5 to 15 show respectively on their left and right the memory cell region MA where the memory transistor MC is formed and the peripheral circuit region TA where the peripheral transistor Tr is formed.

Figure 5:
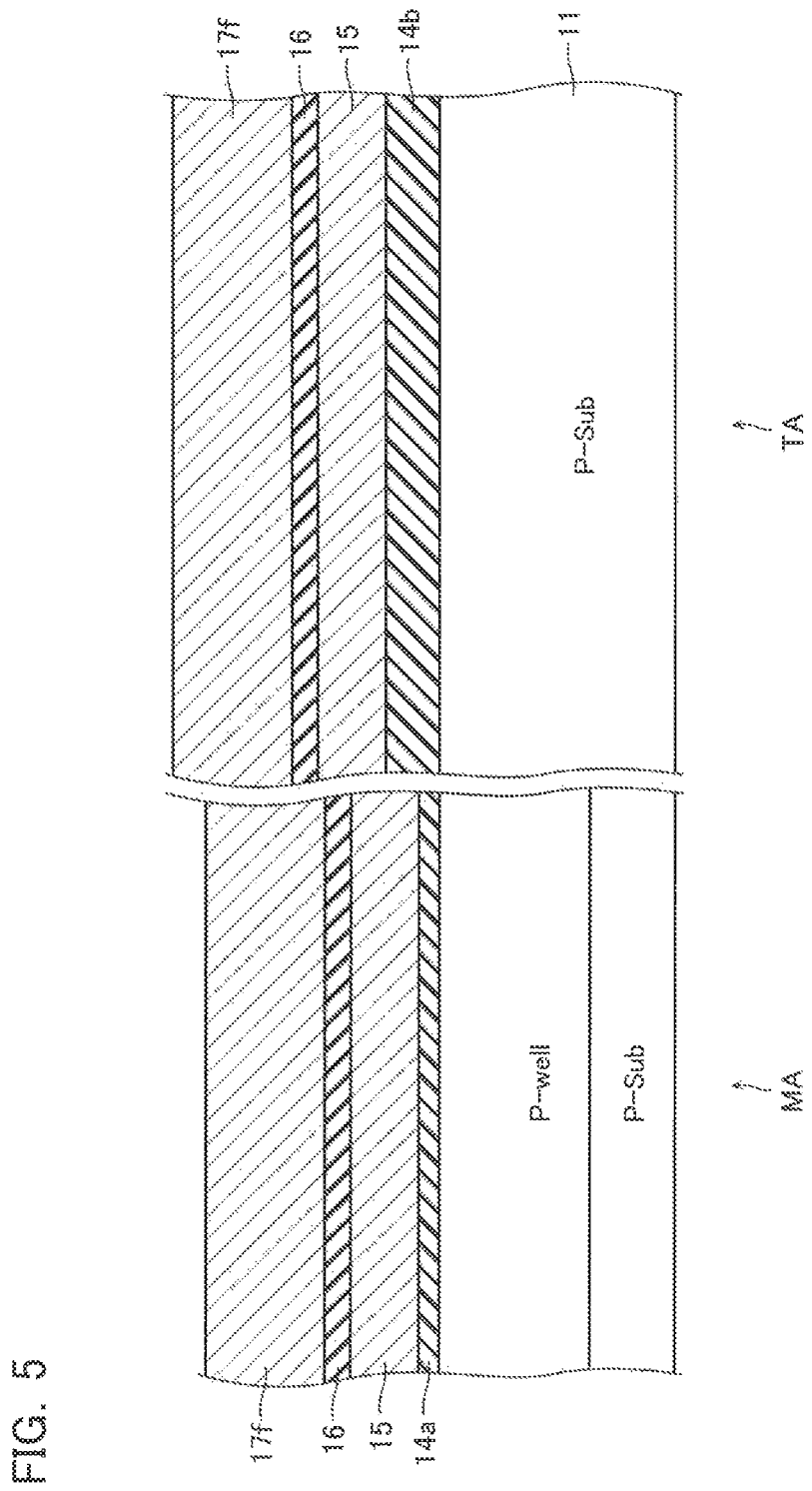
FIG. 5 is a process drawing explaining a method of manufacturing a nonvolatile semiconductor memory device according to the embodiment.

First, as shown in FIG. 5, in the memory cell region MA, the gate insulating film 14a having a film thickness of about 8 nm is deposited on the P type well 11a, while in the peripheral transistor region TA, the gate insulating film 14b having a film thickness of about 20 to 50 nm is deposited on a surface of the silicon substrate 11. Deposited sequentially on an upper surface of such gate insulating films 14a and 14b are: a polycrystalline silicon film 15 which will be the floating gate 15a or the lower gate electrode 15b; an inter-gate insulating film 16; and a polycrystalline silicon film 17f which will be part of the control gate electrode 17a or part of the upper gate electrode 17b.

Figure 6:
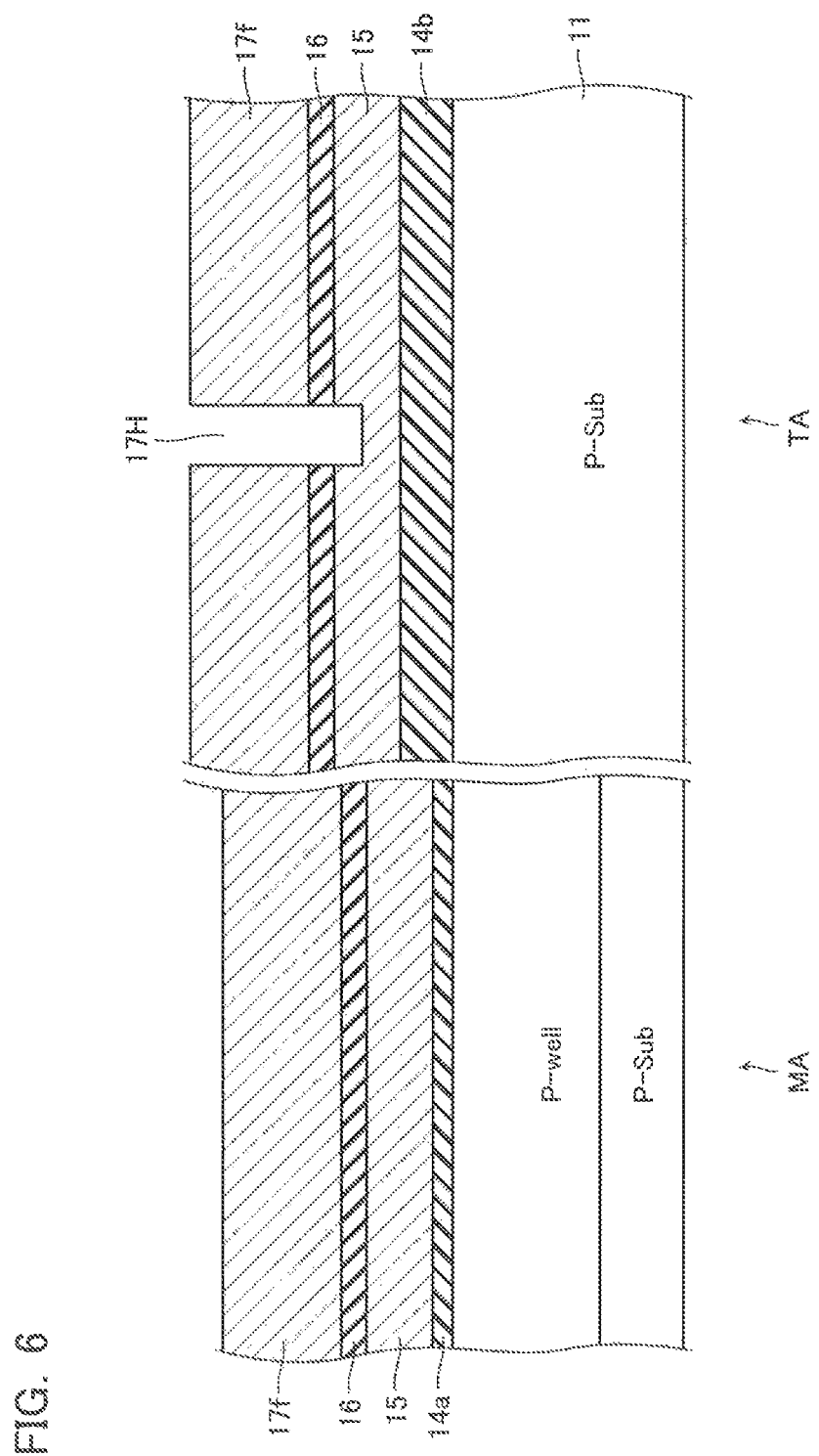
FIG. 6 is a process drawing explaining the method of manufacturing a nonvolatile semiconductor memory device according to the embodiment.
Figure 7:
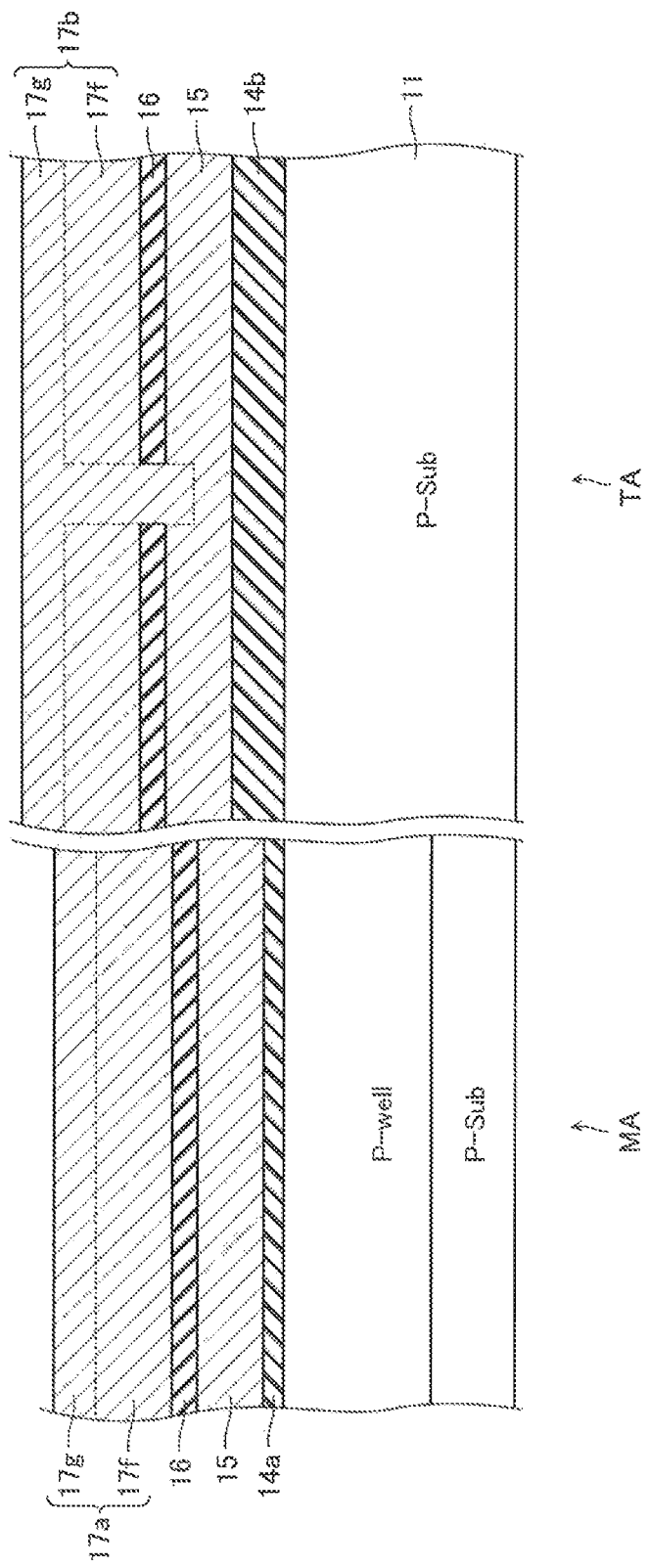
FIG. 7 is a process drawing explaining the method of manufacturing a nonvolatile semiconductor memory device according to the embodiment.

Next, as shown in FIG. 6, in the peripheral transistor region TA, a contact hole 17H penetrating the polycrystalline silicon film 17f and the inter-gate insulating film 16 to reach the polycrystalline silicon film 15, is formed by photolithography and etching. Then, as shown in FIG. 7, a polycrystalline silicon film 17g is further deposited on a surface of the polycrystalline silicon film 17f. In the memory cell region MA, the control gate electrode 17a is formed by the polycrystalline silicon films 17f and 17g. Moreover, in the peripheral transistor region TA, the upper gate electrode 17b is formed by the polycrystalline silicon films 17f and 17g.

Figure 8:
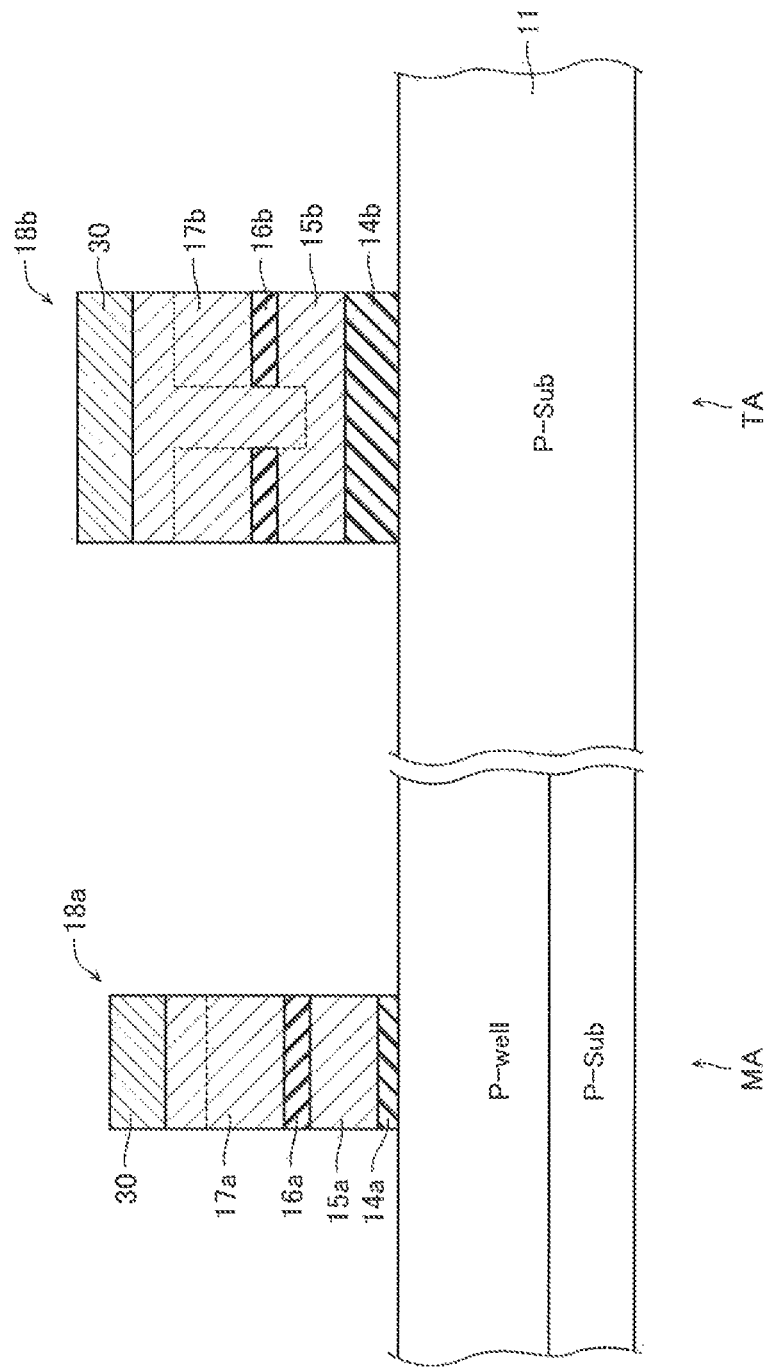
FIG. 8 is a process drawing explaining the method of manufacturing a nonvolatile semiconductor memory device according to the embodiment.

Subsequently, as shown in FIG. 8, the above-mentioned stacked structure is etched to the gate insulating films 14a and 14b, by anisotropic etching adopting a resist 30 as a mask, thereby forming structures of the gate electrodes 18a and 18b.

Figure 9:
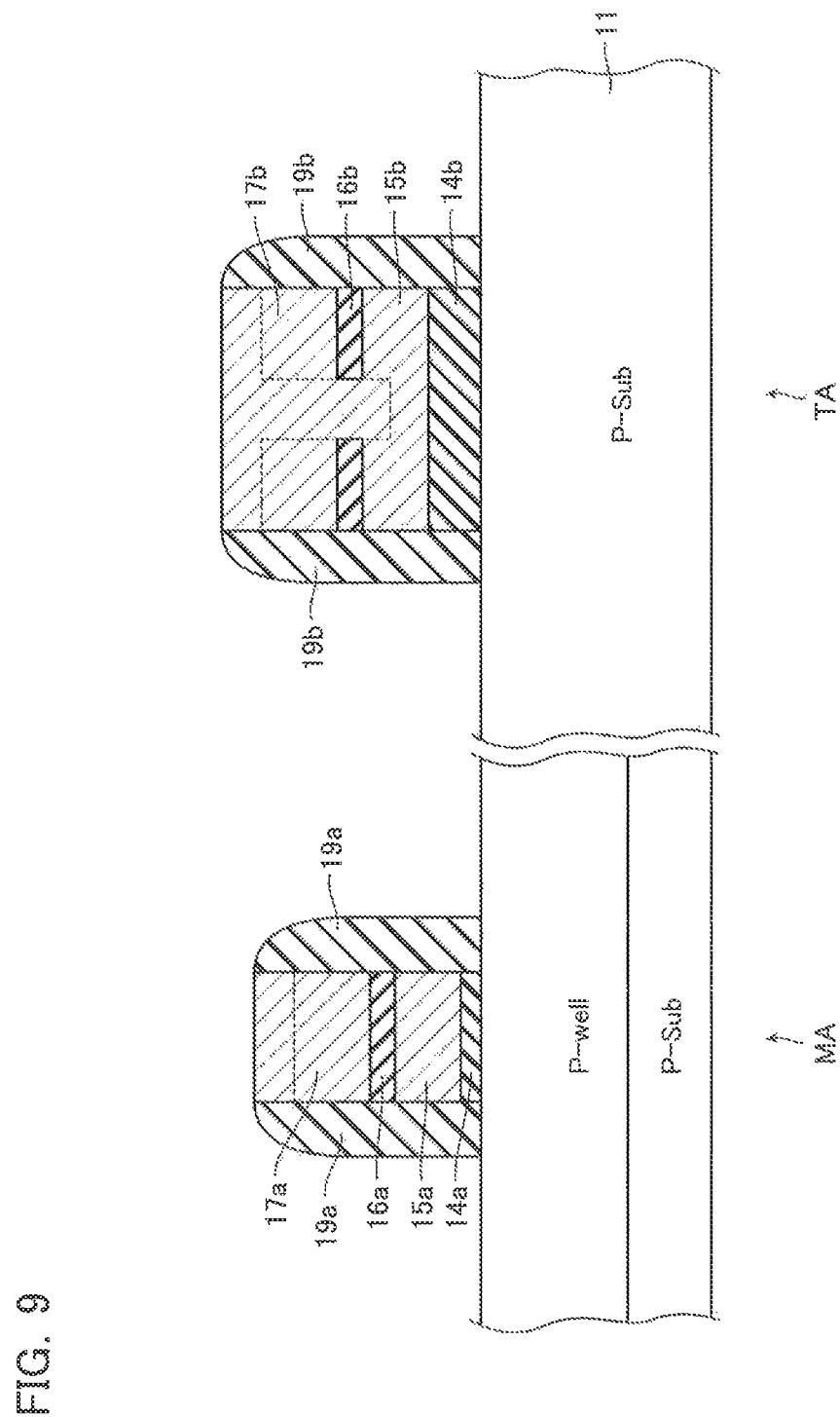
FIG. 9 is a process drawing explaining the method of manufacturing a nonvolatile semiconductor memory device according to the embodiment.
Figure 10:
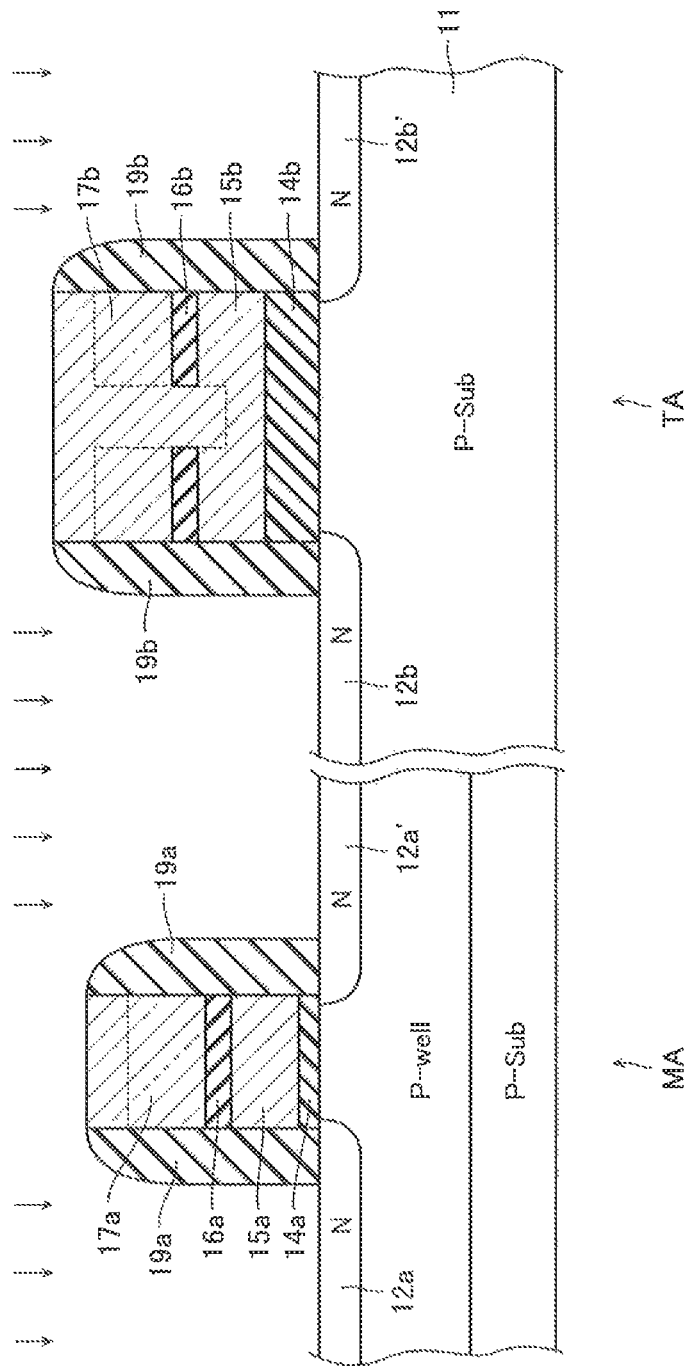
FIG. 10 is a process drawing explaining the method of manufacturing a nonvolatile semiconductor memory device according to the embodiment.

Furthermore, as shown in FIG. 9, the sidewall films 19a and 19b configured from an insulating film such as a silicon oxide film, for example, are deposited on sidewalls of these gate electrodes 18a and 18b. Then, as shown in FIG. 10, ion implantation of the likes of phosphorus (P) is performed in a self-aligning manner on these sidewall films 19a and 19b and gate electrodes 18a and 18b to form the diffusion layers 12a, 12a', 12b, and 12b' in a surface layer of the P type well 11a and the silicon substrate 11.

Figure 11:
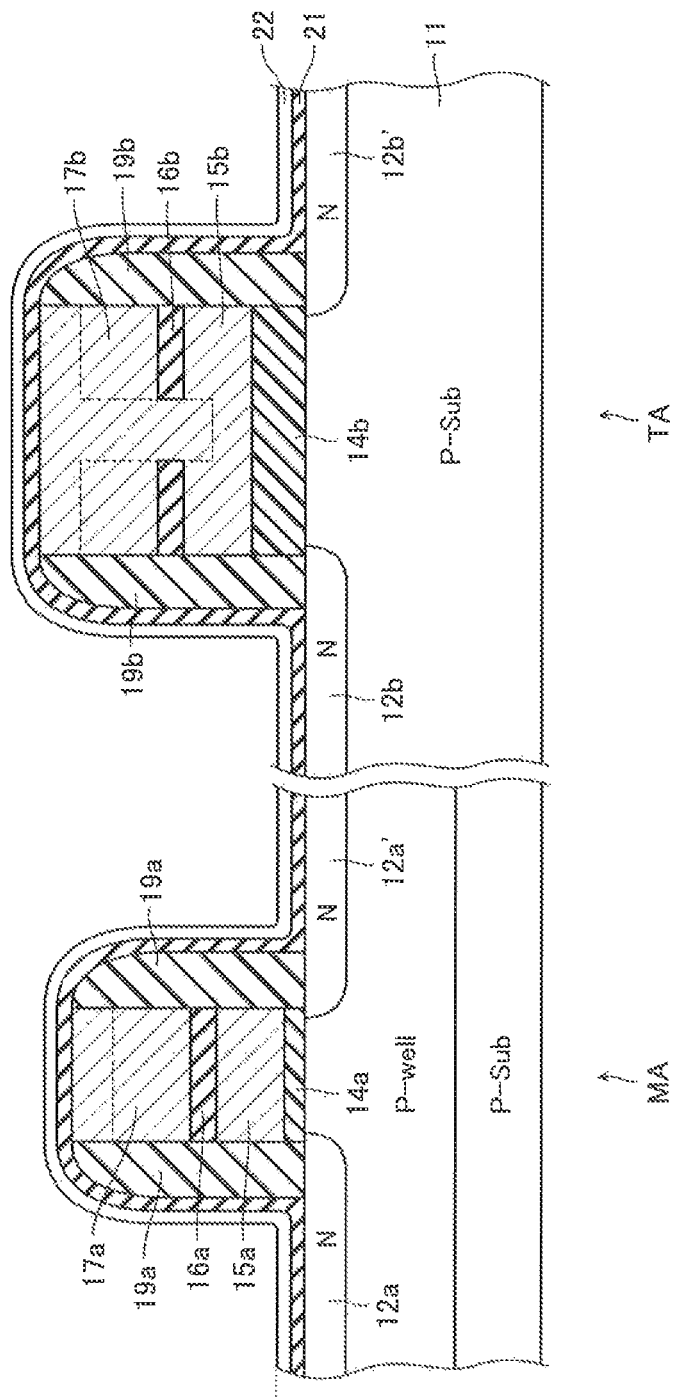
FIG. 11 is a process drawing explaining the method of manufacturing a nonvolatile semiconductor memory device according to the embodiment.

Subsequently, as shown in FIG. 11, the liner film 21 and the polycrystalline silicon film 22 are deposited on an entire surface upward of the silicon substrate 11 including upper surfaces of the gate electrodes 18a and 18b and sidewalls of the sidewall films 19a and 19b.

Figure 12:
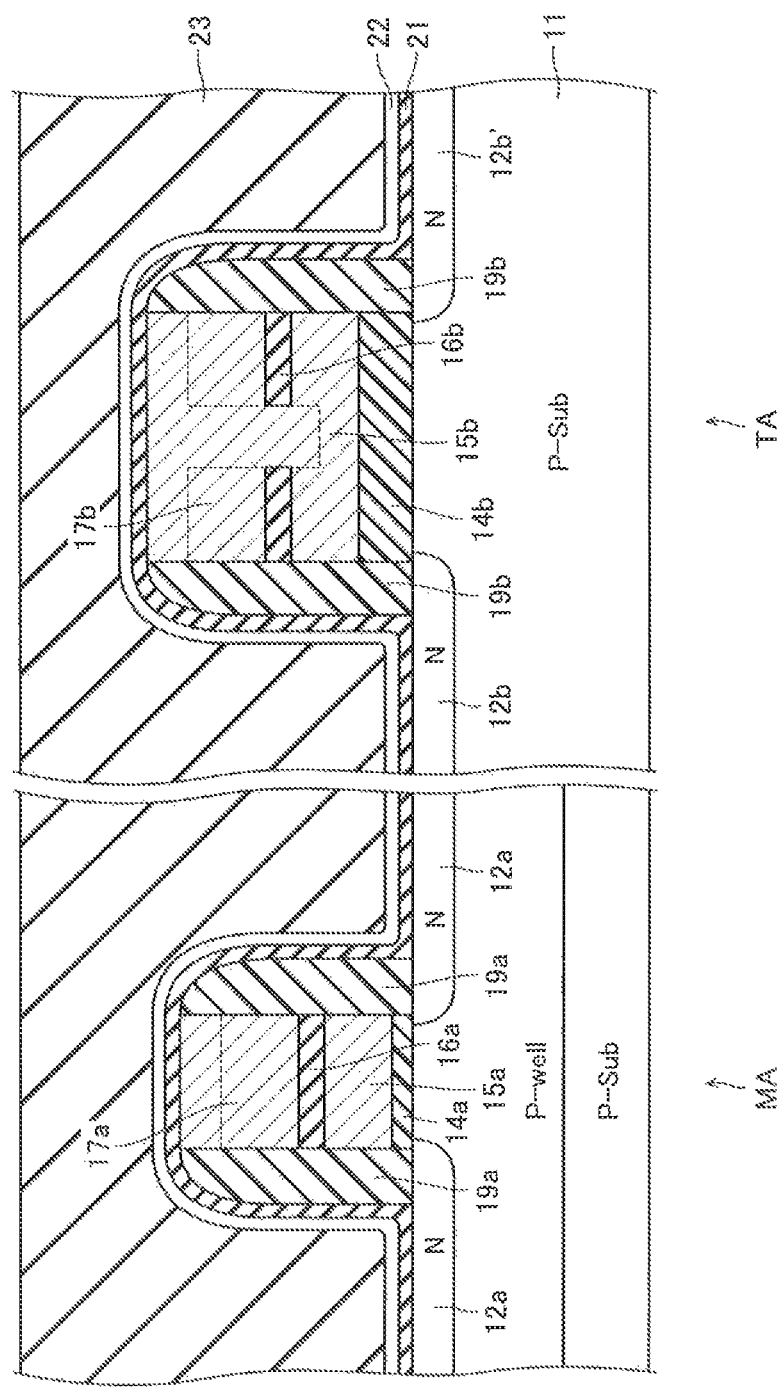
FIG. 12 is a process drawing explaining the method of manufacturing a nonvolatile semiconductor memory device according to the embodiment.

Then, as shown in FIG. 12, the inter-layer insulating film 23 configured from a silicon oxide film is deposited upward of the polycrystalline silicon film 22 so as to bury the structures of the gate electrodes 18a and 18b.

Figure 13:
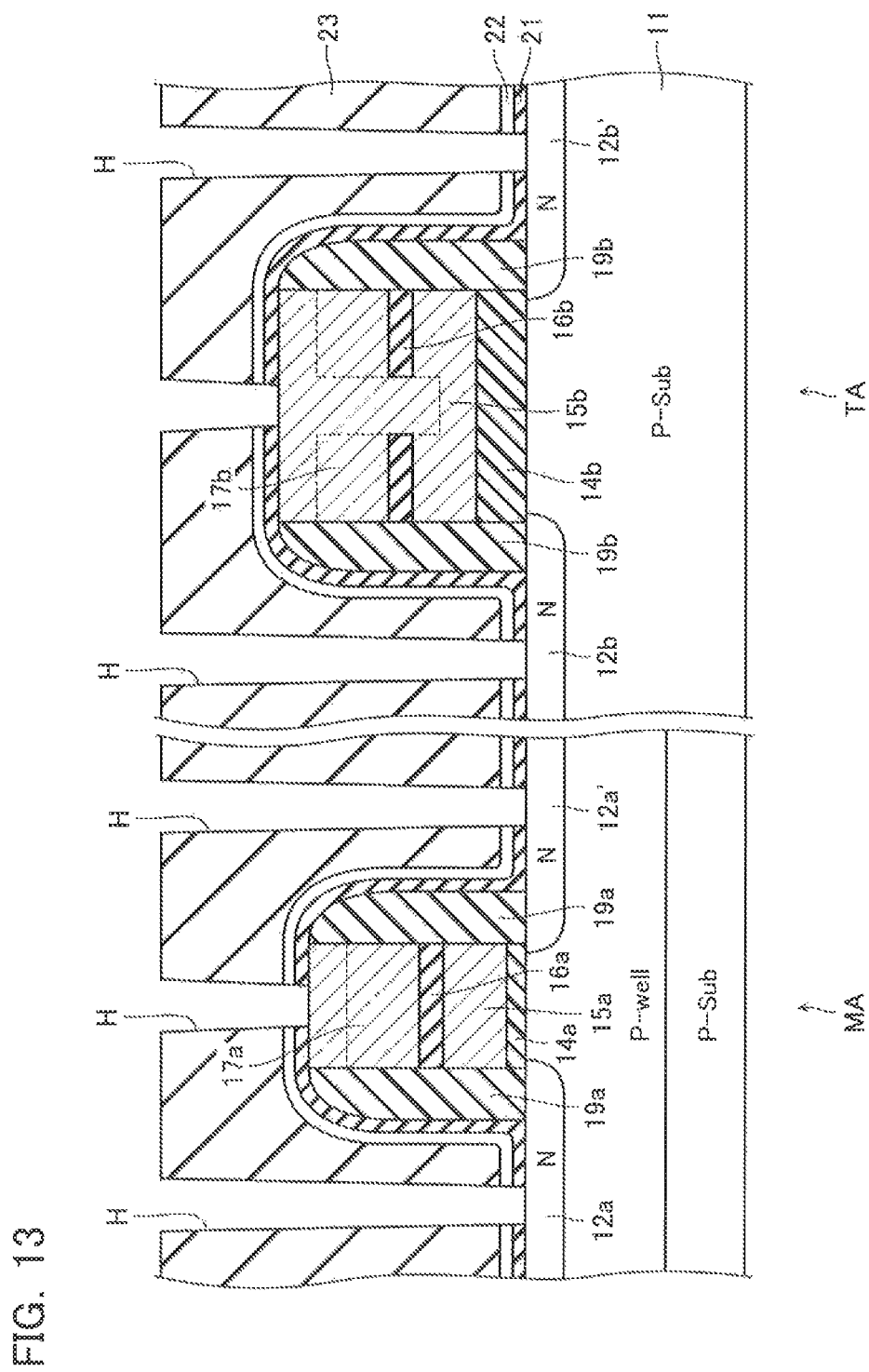
FIG. 13 is a process drawing explaining the method of manufacturing a nonvolatile semiconductor memory device according to the embodiment.
Figure 14:
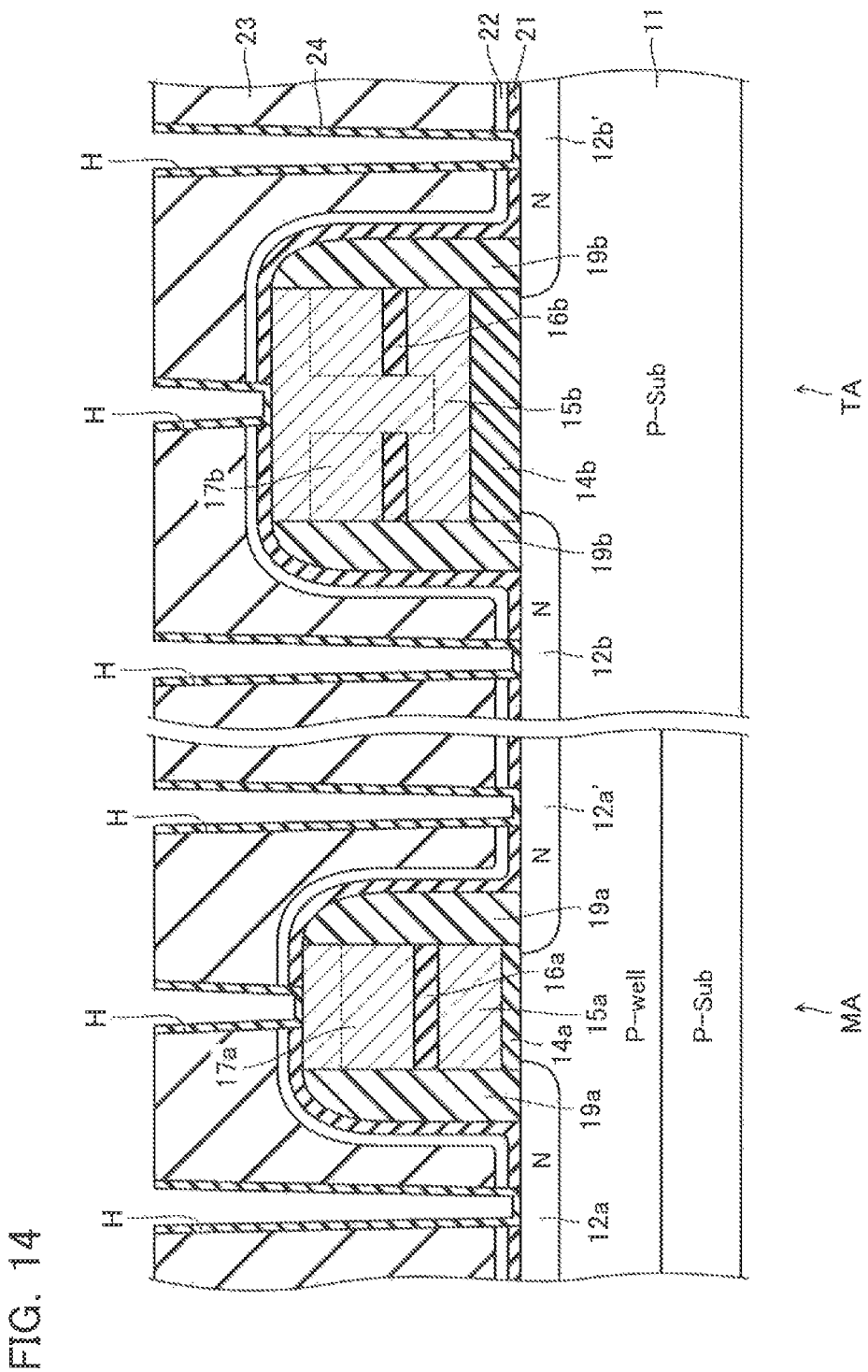
FIG. 14 is a process drawing explaining the method of manufacturing a nonvolatile semiconductor memory device according to the embodiment.
Figure 15:
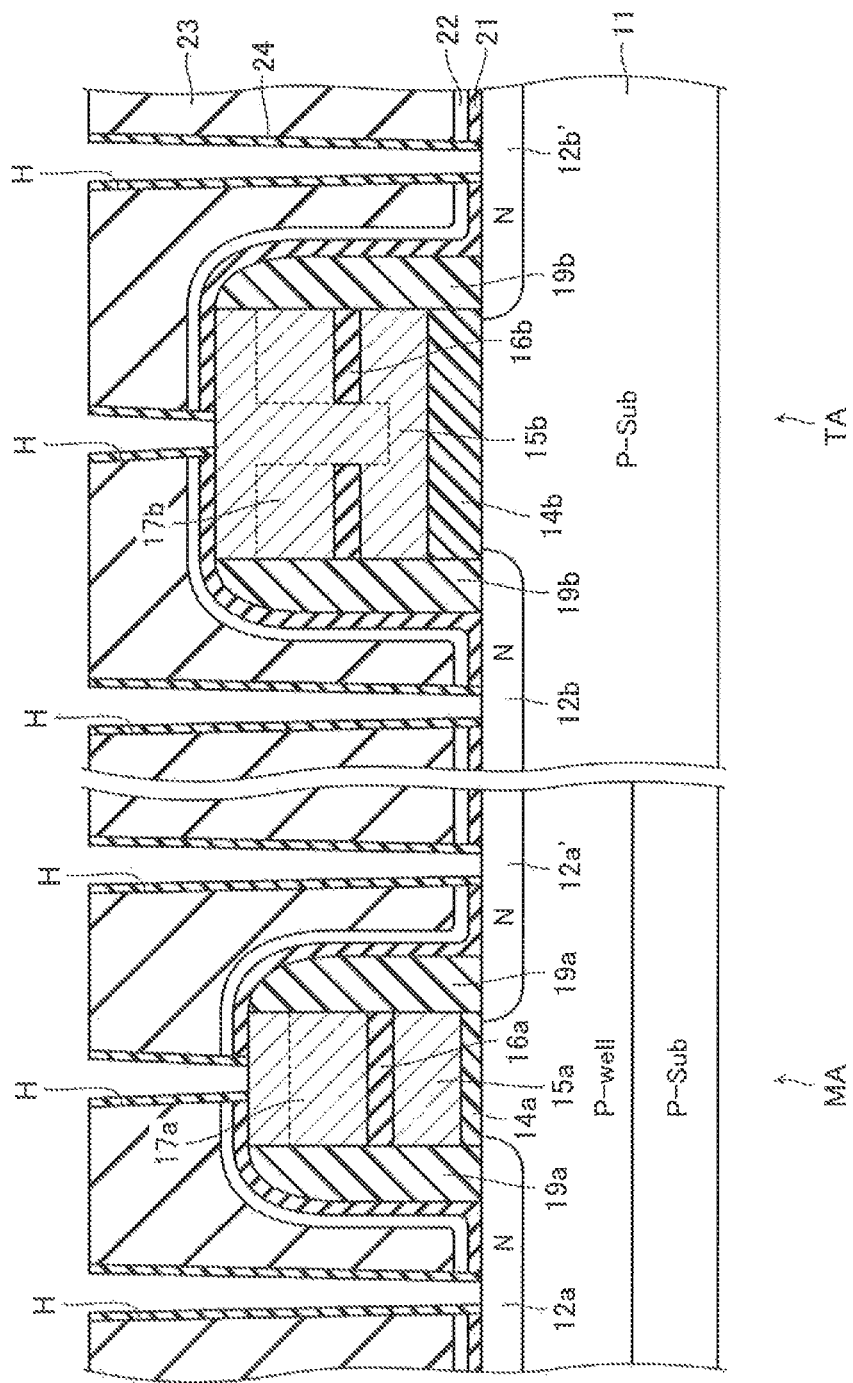
FIG. 15 is a process drawing explaining the method of manufacturing a nonvolatile semiconductor memory device according to the embodiment.

Next, as shown in FIG. 13, the contact hole H penetrating the inter-layer insulating film 23, the polycrystalline silicon film 22, and the liner film 21 to reach the diffusion layers 12a, 12a', 12b, and 12b' and the gate electrodes 17a and 17b, is formed. Then, as shown in FIG. 14, the isolating insulating film 24 configured from an insulating film such as a silicon oxide film, for example, is formed on a side wall of this contact hole H. However, as shown in FIG. 15, the isolating insulating film 24 formed on a bottom surface of the contact hole H is stripped using anisotropic etching, or the like. Subsequently, a sputtering method or the like is employed to implant the contact 25 inside the contact hole H, and the wiring line layer 26 and passivation film 27 are formed, whereby a structure of FIG. 1 is completed.

Advantages

As described above, the semiconductor device of the present embodiment comprises the polycrystalline silicon film so as to cover the gate electrode. As a result, even if, for example, a film including a lot of hydrogen is formed in a layer above the inter-layer insulating film and the hydrogen is diffused, that hydrogen has its movement suppressed by the dangling bond in the surface of the polycrystalline silicon film and does not reach the gate insulating film. Therefore, reliability of the gate insulating film can be prevented from degrading. In addition, such a polycrystalline silicon film can be formed without requiring addition of a complex process and does not lead to large increase in manufacturing costs. Moreover, it is sufficient for the polycrystalline silicon film to be formed with a small film thickness of about 8 nm, for example, and size of the manufacturing equipment is not increased. This polycrystalline silicon film remains also in the final product, hence diffusion of hydrogen during product use after shipment can also be effectively prevented. In this way, the present embodiment makes it possible for deterioration of reliability due to diffusion of hydrogen to be effectively suppressed by addition of a minimal process and moreover without leading to increased size of the manufacturing equipment.

That concludes description of one embodiment, but the above-described embodiment described an example in which, as an example, a NAND type flash memory had the polycrystalline silicon film 22 deposited continuously in the memory cell region MA and the peripheral transistor region TA. However, the above-described embodiment does not mean that the invention is limited to this example. For example, in the above-described embodiment, the polycrystalline silicon film 22 may be provided separately in the memory cell region MA or the peripheral transistor region TA, and the polycrystalline silicon film 22 may be divided at a boundary of the two regions. In addition, the polycrystalline silicon films 22 of the two regions may be manufactured in different processes by different materials. Moreover, the above-mentioned embodiment was described taking a NAND type flash memory as an example, but this polycrystalline silicon film can also be applied to another memory device (such as DRAM, MRAM, and SRAM), for example. In addition, a similar polycrystalline silicon film can be adopted in another semiconductor device that includes a transistor.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a gate insulating film provided on a surface of a channel layer;
   a gate electrode provided on an upper surface of the gate insulating film;
   a diffusion layer provided in the channel layer;
   a polycrystalline silicon film provided so as to cover a surface of the gate electrode and the diffusion layer;
   an inter-layer insulating film provided so as to cover the gate electrode and the polycrystalline silicon film;
   a contact wiring line that penetrates the inter-layer insulating film and the polycrystalline silicon film to reach the gate electrode or the diffusion layer; and
   an isolating insulating film provided between the contact wiring line and the inter-layer insulating film or the polycrystalline silicon film.

2. The semiconductor device according to claim 1, wherein
   a film thickness of the polycrystalline silicon film is 8 nm or more in a cross section thereof.

3. The semiconductor device according to claim 1, wherein
   an average particle diameter of the polycrystalline silicon film is 30 nm or less in a plan view thereof.

4. The semiconductor device according to claim 1, wherein
   a film thickness of the polycrystalline silicon film is 8 nm or more in a cross section thereof, and an average particle diameter of the polycrystalline silicon film is 30 nm or less in a plan view thereof.

5. The semiconductor device according to claim 1, further comprising:
   a liner film provided so as to be sandwiched between the polycrystalline silicon film and the gate electrode or the diffusion layer, the liner film being configured from an insulating film.

6. The semiconductor device according to claim 5, further comprising:
   a sidewall film provided on a side surface of the gate electrode and configured from an insulating film,
   wherein the polycrystalline silicon film is provided above the sidewall film.

7. The semiconductor device according to claim 5, wherein
   a film thickness of the polycrystalline silicon film is 8 nm or more in a cross section thereof.

8. The semiconductor device according to claim 5, wherein
   an average particle diameter of the polycrystalline silicon film is 30 nm or less in a plan view thereof.

9. The semiconductor device according to claim 5, wherein
   a film thickness of the polycrystalline silicon film is 8 nm or more in a cross section thereof, and an average particle diameter of the polycrystalline silicon film is 30 nm or less in a plan view thereof.

10. The semiconductor device according to claim 1, further comprising:
   a sidewall film provided on a side surface of the gate electrode and configured from an insulating film,
   wherein the polycrystalline silicon film is provided above the sidewall film.

11. The semiconductor device according to claim 10, wherein
   a film thickness of the polycrystalline silicon film is 8 nm or more in a cross section thereof.

12. The semiconductor device according to claim 10, wherein
   an average particle diameter of the polycrystalline silicon film is 30 nm or less in a plan view thereof.

13. The semiconductor device according to claim 1, comprising:
   a memory transistor and a peripheral transistor, the memory transistor functioning as a memory cell that stores data in a nonvolatile manner, and the peripheral transistor being included in a peripheral circuit that controls the memory transistor,
   wherein the memory transistor and the peripheral transistor each comprise the gate electrode, and the gate electrode in the memory transistor and the gate electrode in the peripheral transistor are covered by a common polycrystalline silicon film.

14. The semiconductor device according to claim 13, further comprising:
   a liner film provided so as to be sandwiched between the polycrystalline silicon film and the gate electrode or the diffusion layer, the liner film being configured from an insulating film.

15. The semiconductor device according to claim 13, further comprising:
   a sidewall film provided on a side surface of the gate electrode and configured from an insulating film,
   wherein the polycrystalline silicon film is provided above the sidewall film.

16. The semiconductor device according to claim 13, wherein
   a film thickness of the polycrystalline silicon film is 8 nm or more in a cross section thereof.

17. The semiconductor device according to claim 13, wherein
   an average particle diameter of the polycrystalline silicon film is 30 nm or less in a plan view thereof.

* * * * *